(12) United States Patent
Huang et al.

(10) Patent No.: US 11,387,624 B2
(45) Date of Patent: Jul. 12, 2022

(54) RESONANT LASER DRIVER

(71) Applicant: Analog Devices International Unlimited Company, Limerick (IE)

(72) Inventors: Jiannan Huang, San Diego, CA (US); Frank M. Yaul, Somerville, MA (US); Jonathan Ephraim David Hurwitz, Edinburgh (GB); Nicolas Le Dortz, Jamaica Plain, MA (US); Junhua Shen, Wilmington, MA (US)

(73) Assignee: Analog Devices International Unlimited Company, Limerick (IE)

( * ) Notice: Subject to any disclaimer, the term of this patent is extended or adjusted under 35 U.S.C. 154(b) by 226 days.

(21) Appl. No.: 16/781,652

(22) Filed: Feb. 4, 2020

(65) Prior Publication Data
US 2021/0242659 A1    Aug. 5, 2021

(51) Int. Cl.
*H01S 5/042* (2006.01)
*G01S 7/4911* (2020.01)

(52) U.S. Cl.
CPC .......... *H01S 5/0427* (2013.01); *G01S 7/4911* (2013.01)

(58) Field of Classification Search
CPC .............................. G01S 7/4911; H01S 5/0427
USPC ........................................................ 372/26
See application file for complete search history.

(56) References Cited

U.S. PATENT DOCUMENTS

| | | | |
|---|---|---|---|
| 3,755,697 A | 8/1973 | Miller | |
| 4,611,352 A | 9/1986 | Fujito et al. | |
| 4,685,041 A | 8/1987 | Bowman et al. | |
| 4,813,045 A | 3/1989 | Culpepper | |
| 4,849,981 A | 7/1989 | Toda | |
| 5,247,532 A | 9/1993 | Levinson | |
| 5,604,759 A | 2/1997 | Miyaki et al. | |
| 5,883,910 A | 3/1999 | Link | |
| 6,304,356 B1 | 10/2001 | Dubos et al. | |
| 6,697,402 B2 | 2/2004 | Crawford | |
| 6,891,868 B2 | 5/2005 | Verboom et al. | |
| 6,941,080 B2 | 9/2005 | Kasper et al. | |
| 9,295,116 B2 | 3/2016 | Sanders et al. | |
| 10,158,211 B2 | 12/2018 | Barnes et al. | |
| 10,328,276 B2 | 6/2019 | Williams et al. | |
| 2002/0064193 A1 | 5/2002 | Diaz et al. | |
| 2004/0202215 A1 | 10/2004 | Fairgrieve | |
| 2005/0213622 A1 | 9/2005 | Diaz | |

(Continued)

FOREIGN PATENT DOCUMENTS

CN    101895058 B    11/2011
CN    106879107      10/2018

(Continued)

OTHER PUBLICATIONS

"European Application Serial No. 21152066.3, Extended European Search Report dated Jul. 2, 2021", 9 pgs.

(Continued)

*Primary Examiner* — Tuan N Nguyen
(74) *Attorney, Agent, or Firm* — Schwegman Lundberg & Woessner, P.A.

(57) ABSTRACT

A laser emitter circuit comprises a laser diode; a driver circuit configured to generate a drive signal; and a resonant circuit coupled to the driver circuit and the laser diode, wherein the resonant circuit is configured to use the drive signal of the driver circuit to generate a continuous wave sinusoidal drive signal to drive the laser diode.

22 Claims, 10 Drawing Sheets

(56) References Cited

U.S. PATENT DOCUMENTS

| | | |
|---|---|---|
| 2009/0295300 A1 | 12/2009 | King |
| 2010/0177127 A1 | 7/2010 | Akiyama et al. |
| 2010/0232806 A1 | 9/2010 | Kagaya et al. |
| 2011/0216311 A1 | 9/2011 | Kachanov et al. |
| 2012/0268015 A1 | 10/2012 | Sun et al. |
| 2013/0077360 A1* | 3/2013 | Low .................. H02J 50/90 363/47 |
| 2019/0229493 A1* | 7/2019 | Stern .................. H01S 5/0428 |

FOREIGN PATENT DOCUMENTS

| | | |
|---|---|---|
| CN | 113224637 | 8/2021 |
| DE | 102006036167 B4 | 2/2011 |
| TW | 201114327 | 4/2011 |

OTHER PUBLICATIONS

"Interfacing Maxim Laser Drivers with Laser Diodes", Maxim Integrated Application Note HF-2, (Sep. 1, 2000), 14 pgs.

"Microchip AN874 Datasheet: Buck Configuration High-Power LED Driver", Microchip Technology Inc., (2006), 16 pgs.

Abramov, Eli, et al., "Low Voltage Sub-Nanosecond Pulsed Current Driver IC for High-Resolution LIDAR Applications", IEEE Applied Power Electronics Conference and Exposition (APEC), (2018), 8 pgs.

Blasco, Guillermo, et al., "A Sub-ns Integrated CMOS Laser Driver with Configurable Laser Pulses for Time-of-Flight Applications", IEEE Sensors Journal, vol. 18, No. 16, (Aug. 15, 2018), 10 pgs.

Chen, Hua, et al., "A Fast-Transient LDO Based on Buffered Flipped Voltage Follower", IEEE Intl. Conference on Electron Devices and Solid-State Circuits (EDSSC), (2010), 4 pgs.

Glaser, John S, et al., "High Power Nanosecond Pulse Laser Driver using a GaN FET", PCIM Europe; Intl. Exhibition and Conference for Power Electronics, Intelligent Motion, Renewable Energy and Energy Management, Nuremberg, Germany, (Jun. 2018), 8 pgs.

Kilpela, Ari, et al., "Laser pulser for a time-of-flight laser radar", Review of Scientific Instruments, 68(6), (Jun. 1997), 6 pgs.

Nissinen, Jan, et al., "A High Repetition Rate CMOS Driver for High-Energy Sub-ns Laser Pulse Generation in SPAD-Based Time-of-Flight Range Finding", IEEE Sensors Journal, vol. 16, No. 6, (Mar. 15, 2016), 1628-1633.

Rosa, WG, et al., "Self-Oscillating Resonant Converter for LED Applications at 500 KHZ", 2017 Brazilian Power Electronics Conference (COBEP), Juiz de Fora, BR, (2017), 7 pgs.

Tsai, Yi-Chuan, et al., "Design and Implementation of Single-Stage LED Driver with High Frequency Pulse", IEEE 2nd Intl. Future Energy Electronics Conference (IFEEC), Taipei, TW, (2015), 6 pgs.

* cited by examiner

EQUIV. SWITCH MODEL

RESONANT LASER DRIVER

FIELD OF THE DISCLOSURE

This document relates generally to electronic circuits for optical applications, and in particular it relates to electronic circuits that include a laser emitting diode.

BACKGROUND

Time-of-flight (ToF) is a technique for three-dimensional (3D) imaging. The technique illuminates the object with a modulated light and receives reflected light. Based on the modulating frequency and the phase difference between the transmitted and received light, the distance between the camera and the object can be calculated. This phase shift can be detected either using a pulsed approach or a continuous-wave (CW) approach. The CW approach traditionally uses a square wave because it is easily realizable using digital circuits. However, a square wave output is less efficient than using a sinusoidal wave, and using a square wave also suffers from the harmonic contents that impose difficulty in depth calibration. Because of the lack of harmonics, using a sinusoidal wave provides better depth performance but the generation of a sinusoid also presents challenges in the driver design.

SUMMARY OF THE DISCLOSURE

This document relates generally to driver circuits for laser diodes and methods of their operation. A laser emitter circuit according to various aspects includes a laser diode; a driver circuit configured to generate a drive signal; and a resonant circuit coupled to the driver circuit and the laser diode, wherein the resonant circuit is configured to use the drive signal of the driver circuit to generate a continuous wave sinusoidal drive signal to drive the laser diode.

A laser diode drive circuit according to various aspects includes a driver circuit configured to generate a drive signal; a resonant circuit having an input coupled to an output of the driver circuit and having an output for coupling to a laser diode, wherein the resonant circuit is configured to produce a continuous wave sinusoidal drive signal from the drive signal to drive the laser diode; and a bias circuit including a bias inductance for coupling to the laser diode.

A method of operating a time of flight sensor according to various aspects includes generating a drive signal using a drive circuit; producing, using a resonant circuit, a continuous wave sinusoidal drive signal from the drive signal; and driving the laser diode using the continuous wave sinusoidal drive signal.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
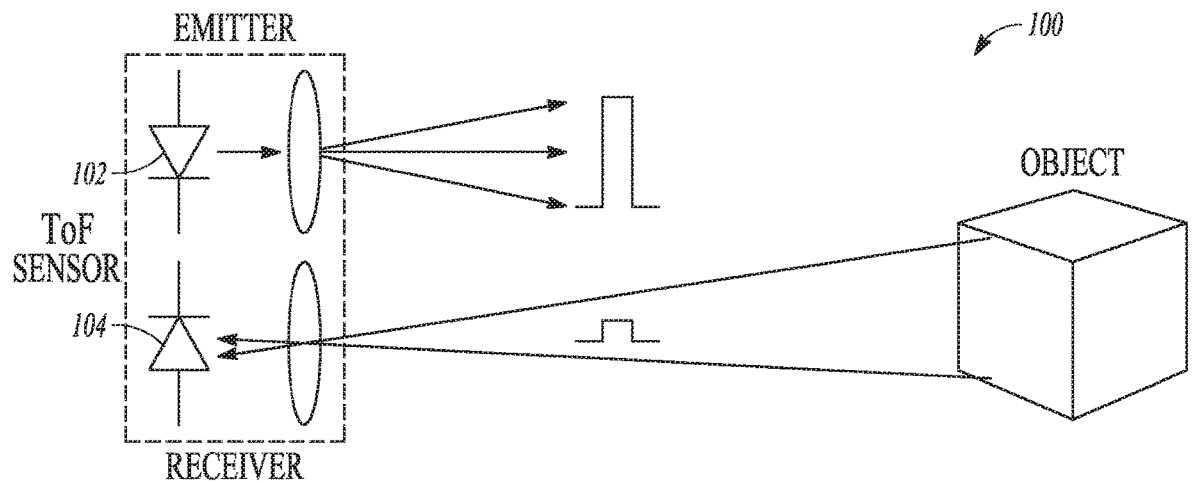
FIG. 1 is an illustration of an example of a time of flight (ToF) sensor.

FIG. 1 is an illustration of an example of a time-of-flight (ToF) sensor. The ToF sensor 100 includes an emitter and a receiver. The emitter can include a laser diode 102 that converts electrical current to light energy. The receiver can be a photo diode 104 that converts received light energy into electrical current or voltage.

To obtain depth information for imaging, the laser emitter may send a laser pulse to the object and the receiver detects the reflected laser energy including phase information. A timer is started when the emitter sends out a light pulse and the timer is stopped when a pulse reflected from an object is received at the ToF sensor. Based on the time it takes for the pulse to do the round trip ($t_{receive} - t_{emit}$) and the speed of light c, the depth information d of the object can be calculated as $$d = \frac{c * (t_{receive} - t_{emit})}{2}.$$

As explained previously herein, a CW approach for ToF imaging can include driving the laser diode 102 with a square wave, but using a square wave is inefficient and suffers from the harmonic contents that impose difficulty in depth calibration.

Figure 2:
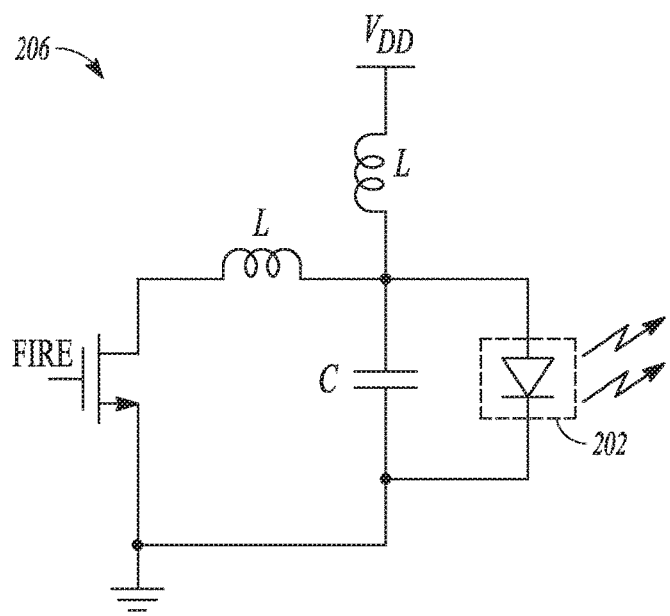
FIG. 2 is a circuit schematic of an example of a laser emitter circuit for a ToF sensor.

FIG. 2 is a circuit schematic of an example of a laser emitter circuit 206 for a ToF sensor. The circuit is a resonant laser diode (LD) driver. The LD 202 may be a vertical cavity surface emitting laser (VCSEL) diode or an edge emitting laser (EEL) diode. The inductors L and the capacitor C form a resonant LC circuit that resonates when the transistor M is activated. The ringing of the LC circuit drives the LD 202 with a continuous wave (CW) signal. The inductors L may be the parasitic inductance of bonding wires. This approach takes advantage of the bonding wire inductance rather than using discrete inductors and trying to minimize the bonding wire inductance. However, the values of inductance and capacitance need to be tuned to the implementation.

Figure 3:
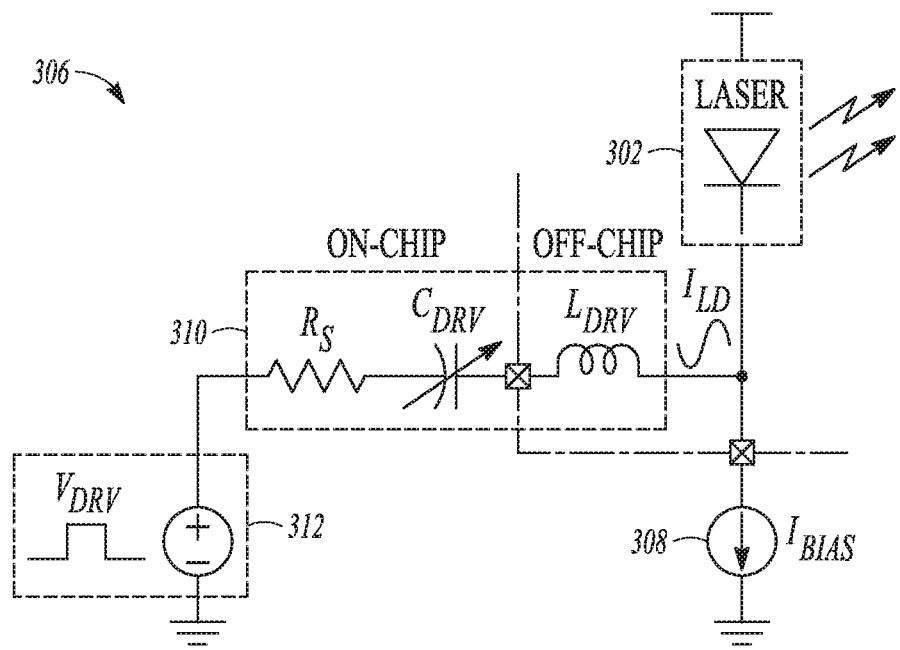
FIG. 3 is a circuit schematic of another example of a laser emitter circuit.

FIG. 3 is a circuit schematic of another example of a laser emitter circuit 306. The circuit uses a 3.3 Volt supply ($V_{DD}$=3.3V) to facilitate system integration. The circuit is also a resonant LD drive circuit, but the resonant circuit 310 includes a series RLC comprised of resistive circuit element $R_D$ which can be the lumped parasitic resistance along the series RLC tank circuit, capacitive circuit element $C_{DRV}$ arranged in series to the drive signal source 312 that provides the input signal ($V_{DRV}$), and inductive circuit element $L_{DRV}$ arranged in series to $C_{DRV}$ and a cathode of LD 302. In variations, the resonant LD drive circuit may be coupled to the anode of LD 302. The input signal DRV can be a square wave signal. The resonant circuit 310 filters the square wave signal to produce a continuous wave sinusoidal drive signal to drive the LD 302. The input signal does not have to be a square wave signal. The input signal $V_{DRV}$ to the circuit can have any type of waveform where significant energy of the input signal is present at substantially the resonant frequency of the resonant circuit 310 (e.g., within 10-20% or less of the resonant frequency).

FIG. 3 shows that the drive signal source 312 and the capacitive circuit element $C_{DRV}$ can be included in an integrated circuit or chip, and the inductive circuit element $L_{DRV}$ and LD 302 can be off-chip components. FIG. 3 also shows a bias circuit 308 that can be on-chip and is coupled to the cathode of the LD 302.

The bias circuit 308 can be a current source that supplies a bias current $I_B$ to LD 302 to ensure that the LD 302 remains on for the driving sinusoidal signal from the resonant circuit 310. The LD 302 needs a certain minimum amount of threshold current $I_{TH}$ to "turn on" the laser diode for efficient light emission without distortion. For example, $I_{TH}$ may be 1.0-1.5 Amps (1.0-1.5 A). Because the current driving the LD 302 is sinusoidal, to avoid dipping below $I_{TH}$, the minimal bias current of LD is given by $I_B = I_A + I_{TH}$, where $I_A$ is the maximal amplitude of the driving sinusoid. The typical value for $I_A$ can be high (e.g., 3 A to 5 A). The LD 302 can be approximated as a DC voltage source with a typical voltage drop of 2V for example. Given the standard 3.3V supply, the available voltage headroom for the bias circuit 308 is about 1.3V.

Figure 4:
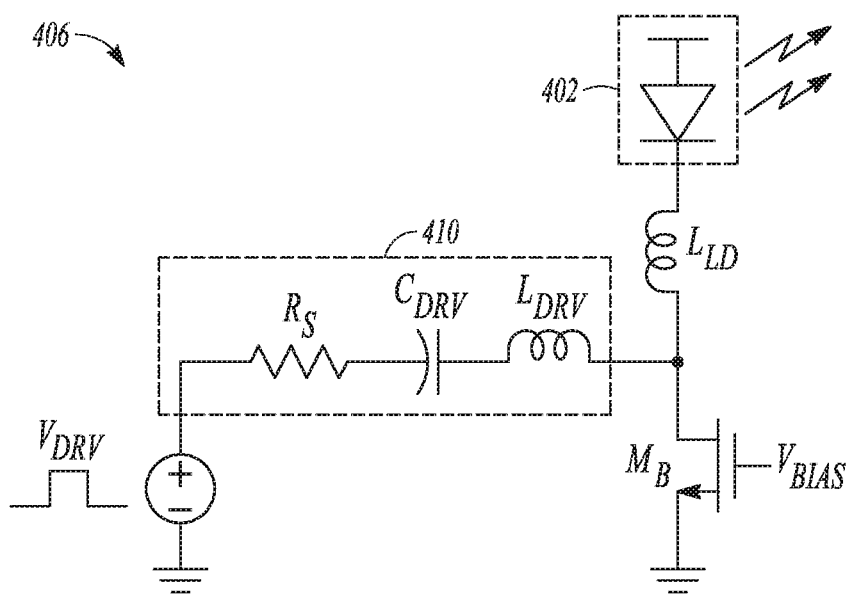
FIG. 4 is a circuit schematic of another example of a laser emitter circuit.

FIG. 4 is a circuit schematic of another example of a laser emitter circuit 406. The circuit includes an input signal source $V_{DRV}$, a resonant circuit 410, and an LD 402 as in FIG. 3. FIG. 4 also includes a bias transistor $M_B$ of the bias circuit 308 in FIG. 3, and shows a parasitic inductance $L_{LD}$. The parasitic inductance $L_{LD}$ represents parasitic bonding wire inductances of the anode and cathode of the LD 402 (the parasitic inductances are lumped together to the cathode as $L_{LD}$ in FIG. 4). The parasitic inductance can be of the order of 0.5 nano-Henrys (0.5 nH), which can cause ripples on summing node A in FIG. 4. The ripple amplitude is given by $V_{ripple} = 2\pi f L_{LD} I_A$, where $I_A$ and f are the amplitude and frequency of the LD current, respectively. Given typical values (e.g., f=200 MHz, $I_A$=3 A) of LD current, $V_{ripple}$ can be as high as 1V. This may severely limit the headroom down for the bias circuit to a minimum of 0.3V and modulates the $V_{DS}$ of the bias transistor $M_B$.

An approach to resolving the limited headroom issue is to increase the output impedance of the current source of the bias circuit 308 of FIG. 3. This can be achieved by making the transistor channel length L longer or adding a cascode transistor to the current source. However, such an approach suffers from a parasitic parallel LC tank circuit.

Figure 5:
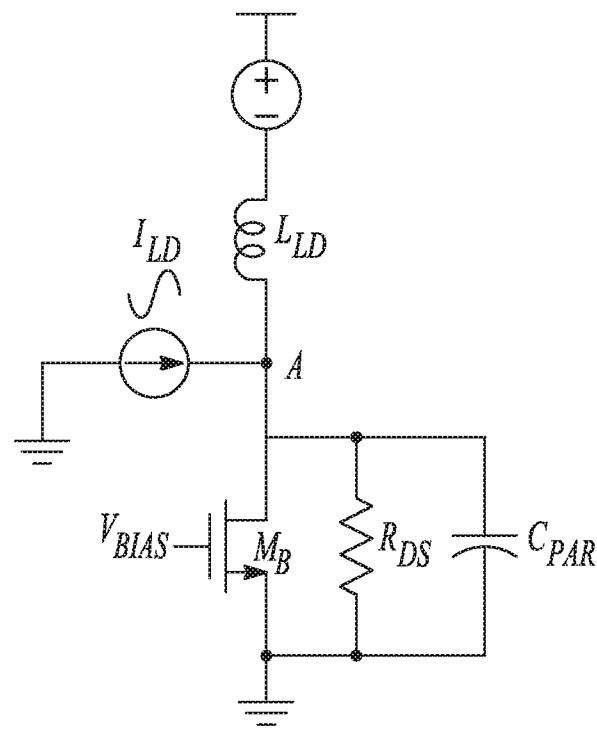
FIG. 5 is another circuit schematic of the example circuit of FIG. 4.

FIG. 5 is a circuit diagram of the circuit of FIG. 4 to illustrate the formation of the parasitic LC tank circuit. The resonant circuit 410 of FIG. 4 is lumped into a sinusoidal current source $I_{LD}$, and the LD 402 of FIG. 4 is modeled as a DC voltage source with voltage drop $V_{LD}$. Also, the drain-to-source resistance $R_{DS}$ of transistor $M_B$ is shown and all the parasitic capacitance from summing node A to ground in FIG. 4 is lumped together as $C_{PAR}$.

Figure 6:
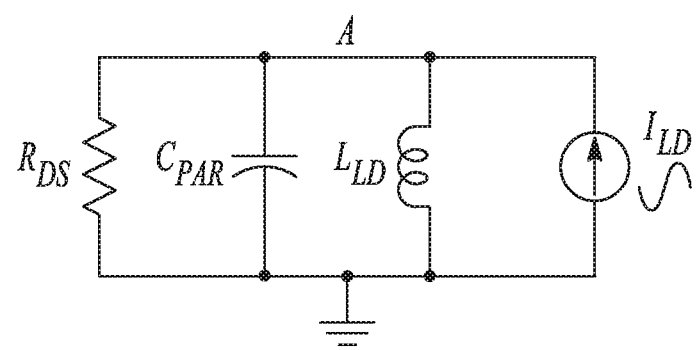
FIG. 6 shows the small signal circuit model of the example circuit of FIG. 5.

FIG. 6 shows the small signal circuit model of FIG. 5 which indicates the extent of the parasitic parallel LC tank circuit of $L_{LD}$ and $C_{PAR}$. A higher output resistance $R_{BIAS}$ of the current source of the bias circuit 308 of FIG. 3 means a higher drain-to-source resistance $R_{DS}$. This in turn means a higher quality factor Q of the parasitic parallel LC tank circuit. The traditional approach of increasing the output impedance of the bias circuit 308 will boost the Q of the parallel tank. As the parasitic parallel LC tank circuit generally has a much higher resonant frequency than the main resonant circuit 410 in FIG. 4, the total harmonic distortion (THD) of the laser diode current $I_{LD}$ in FIGS. 5 and 6 degrades dramatically.

Figure 7A:
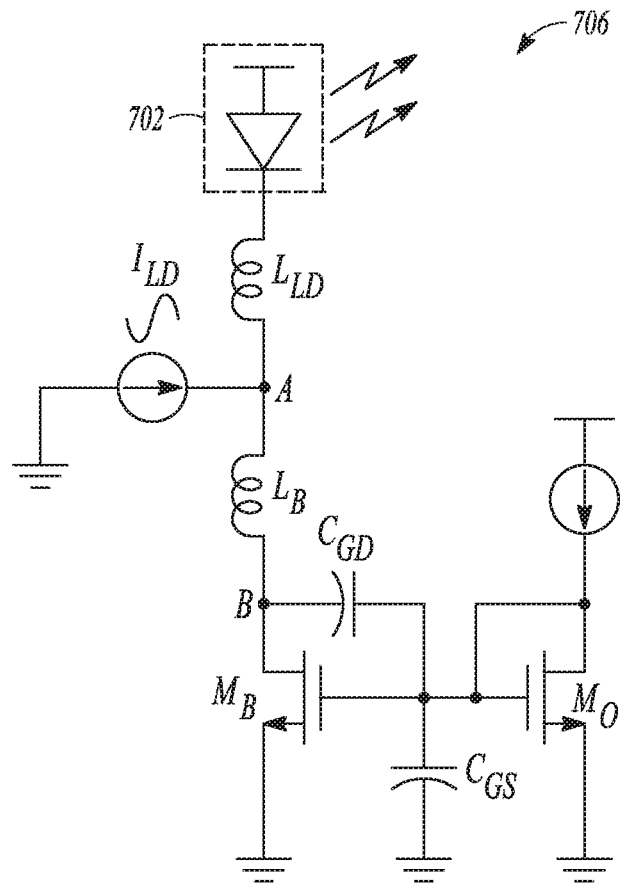
FIG. 7A is a circuit schematic of another example of a laser emitter circuit.

FIG. 7A is a circuit schematic of another example of a laser emitter circuit 706 to solve the headroom issue of the current source. The $V_{DRV}$ drive signal source 312 and the resonant circuit 310 of FIG. 3 are represented by sinusoidal current source $I_{LD}$ in FIG. 7, and the circuit 706 includes the LD 702 and shows the parasitic inductance $L_{LD}$ of the laser diode. The bias circuit 308 of FIG. 3 is implemented as a current mirror in FIG. 7A comprised of bias transistor $M_B$ and transistor $M_0$. The gate-to-drain capacitance $C_{GD}$ and gate-to-source capacitance $C_{GS}$ of transistor $M_B$ are shown. The circuit 706 resolves the issue of the limited headroom for the bias circuit 308 in FIG. 3 by including a bias inductance $L_B$ in the bias circuit. In the example of FIG. 7A, $L_B$ is in series from the summing node A to circuit node B at bias transistor $M_B$. Bias inductance $L_B$ is much larger than parasitic inductance $L_{LD}$ ($L_B >> L_{LD}$) and may be an inductor or may be the parasitic inductance from bonding wires. The bias inductance may be either at the top or bottom of the bias transistor, or may be at both the top and bottom of the bias transistor.

The ratio of the current mirror is intentionally made to be large. In some aspects, ratio of current of the first current mirror leg to current of the second current mirror leg is greater than 100. In certain aspects, the ratio of the currents in the mirror is 400. For example, the current in the $M_B$ branch may be 4 A and the current in the $M_0$ branch may be 10 milliamps (10 mA). The large current ratio has two effects. First, the impedance looking into the gate terminal of $M_0$ becomes a relatively high impedance node because the size of $M_0$ is very small. Second, the large size of $M_B$ means a large gate-to-drain capacitance $C_{GD}$, which effectively makes $M_B$ diode connected with $$R_{DS} \cong \frac{2}{gm}$$

where gm is the transconductance of $M_B$ and the factor 2 is due to the capacitive division between $C_{GD}$ and $C_{GS}$. Because the current through $M_B$ is very large, 2/gm, and consequently $R_{DS}$, is very small, which greatly attenuates the voltage ripple from circuit node A to circuit node B.

Figure 7B:
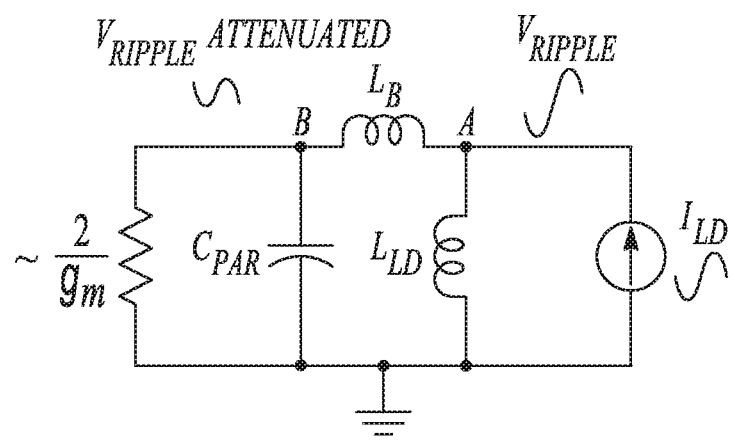
FIG. 7B is the small signal circuit model of the circuit of FIG. 7A.

FIG. 7B is the small signal circuit model of the circuit of FIG. 7A. As shown in FIG. 7B, the large Vripple at node A is shielded from $M_B$ so that $M_B$ sees a reduced Vripple and a relatively stable $V_{DS}$. However, the bias branch of the current mirror still has a high output impedance that is provided by $L_B$ because $L_B \gg L_{LD}$, so that the current from the resonant circuit $I_{LD}$ will mostly flow to the laser diode 702 instead of the bias circuit. The issue of the parasitic parallel LC tank circuit is also resolved. The added inductance $L_B$ together with the small $R_{DS}$ (=2/gm) of the parasitic tank circuit greatly reduces the Q of the parasitic tank circuit from $$Q = \frac{R_{DS}}{\omega L_{LD}} \text{ to } Q = \frac{2}{\omega(L_{LD} + L_B)gm}.$$

Further, note that adding $L_B$ does not affect the operation of the resonant circuit because it is connected in parallel with $L_{LD}$, which is very small. In practice, given that $L_{LD}$ is 0.5 nH, a value of $L_B$ of 2.0 nH is enough to yield good performance at a drive signal frequency of 200 megahertz (200 MHz). As noted above, designers may choose to implement $L_B$ in the form of parasitic wire inductance in either the drain or source terminal or both of $M_B$.

The amplitude of the laser diode drive current is $$I_A = \frac{V_{DRV}}{R_S} * \frac{4}{\pi}$$

Figure 8:
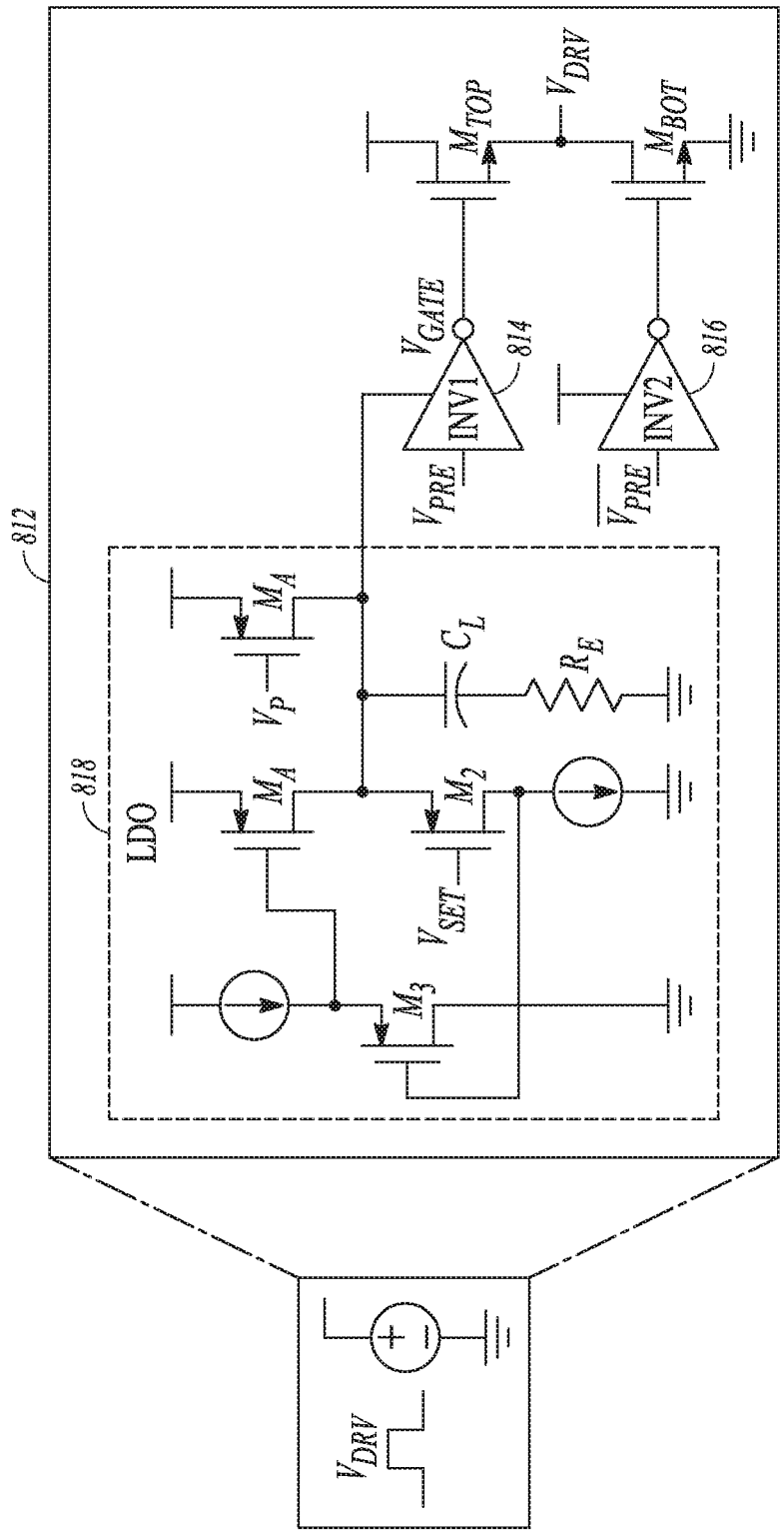
FIG. 8 is a circuit schematic of an example of an implementation of a drive signal generator circuit.

The amplitude of the drive current can be tuned by adjusting the voltage $V_{DRV}$ of the input signal to the resonant circuit. FIG. 8 is a circuit schematic of an example of a driver circuit 812 with tunable amplitude. The driver circuit 812 includes a main driver circuit that includes power transistors $M_{TOP}$, $M_{BOT}$ and a pre-driver circuit that includes inverter buffers 814, 816. The circuit 812 can provide the input signal $V_{DRV}$ of FIG. 3. Signals $V_{PRE}$ and $\overline{V_{PRE}}$ are complementary square waves with rail-to-rail signal swing at the resonant frequency of the resonant circuit 310 of FIG. 3. The signals each drive an inverter buffer 814, 816 that each drive a power transistor $M_{TOP}$ and $M_{BOT}$ to produce the drive signal $V_{DRV}$ input to the resonant circuit.

Both power transistors act as switches to generate a square wave signal. However, inverter buffer 816 draws power from the main circuit supply (e.g., $V_{DD}$) whereas inverter buffer 814 draws power from a low dropout voltage regulator circuit LDO 818 that has a tunable output voltage $V_{TOP}$. This causes the output $V_{GATE}$ of inverter 813 to also have tunable amplitude according to $V_{TOP}$. Because transistor $M_{TOP}$ is an n-type metal oxide semiconductor (NMOS) device, a change in $V_{GATE}$ will translate to a corresponding change in the amplitude of $V_{DRV}$. In this way, the amplitude of $V_{DRV}$ can be tuned by tuning $V_{TOP}$, the circuit supply to inverter 814, which is much easier to do than to directly tune the main circuit supply. Tuning the amplitude of $V_{DRV}$ tunes the amplitude of the continuous wave sinusoidal drive signal output from the resonant circuit. This makes the amplitude of the drive signal of the laser diode (e.g., LD 302 in FIG. 3) tunable.

The voltage $V_{TOP}$ can be tuned by the LDO 818 which is formed by transistors $M_1$-$M_3$. The LDO 818 uses a buffered flipped voltage follower circuit topology. Transistor $M_2$ acts as a source follower so that by changing the gate voltage of $M_2$ or $V_{SET}$, voltage $V_{TOP}$ is changed accordingly. The circuit feedback loop formed by $M_1$ and $M_3$ further reduces the output impedance by the loop gain and increases the sourcing capability. In practice, the LDO 818 should provide very high instantaneous current in a very short time to charge the gate capacitance of $M_{TOP}$.

Figure 9:
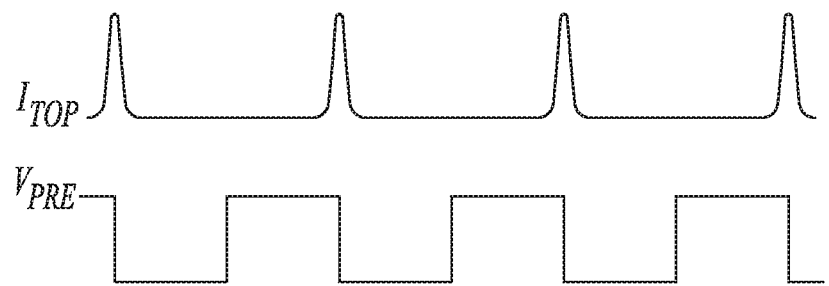
FIGS. 9-10 are illustrations of waveforms associated with operation of the circuit of FIG. 8.

FIG. 9 is an illustration of waveform $V_{PRE}$ which drives inverter buffer 814 and waveform $I_{TOP}$ which is the current supplied to inverter buffer 814 from LDO 818. The waveform $I_{TOP}$ is a representation of the desired high instantaneous current to charge the gate capacitance of $M_{TOP}$. This instantaneous current could be provided by a large off-chip capacitor but adding a bulky external circuit component is undesirable. It should be noted that the LDO 818 only needs to provide charge at a transition (e.g., the falling edge) of $V_{PRE}$ as shown in FIG. 9. To avoid using a large off-chip capacitor, an assistive pull up can be added to the LDO 818. This pull up is provided pull up transistor $M_A$ which is coupled to the output of the LDO 818 and is controlled by $V_P$.

Figure 10:
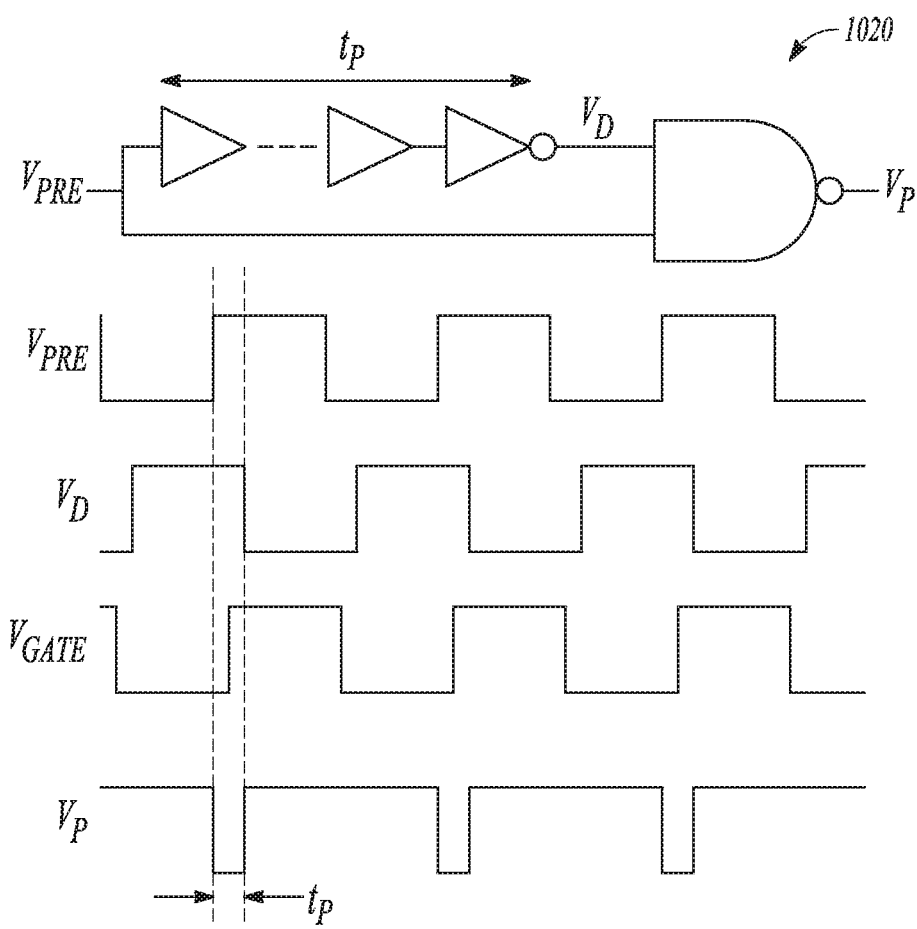

FIG. 10 shows an example of a pulse generator circuit 1020 that can generate the control signal $V_P$ for pull up transistor $M_A$ from signal $V_{PRE}$, and also shows waveforms associated with the operation of the circuit 1020. As shown in FIG. 10, $V_P$ is a negative pulse that only turns transistor $M_A$ "on" during the falling edge of $V_{PRE}$, so that the majority of the charge provided to the gate capacitance of $M_{TOP}$ is provided by the assistive path from transistor $M_A$. The control signal $V_P$ can be a negative pulse generated using the circuit 1020, and the pulse width tp of the negative pulse can be adjusted by the delay chain in the pulse generator circuit 1020 to optimize for the best pull up timing.

In certain aspects, the pulse width of the $V_{DRV}$ signal can be adjustable by the drive circuit (e.g., the duty cycle can be changed to something other than a 50:50 duty cycle). This may be useful to reduce the harmonic content of the continuous wave signal that drives the laser diode or allow for pre-distortion of the continuous wave signal. In certain aspects, the amplitude of the $V_{DRV}$ signal can be adjusted by the driver circuit to provide a multi-level drive signal. For example, the drive circuit may include a digital-to-analog converter (DAC) circuit to set the level of the $V_{DRV}$ signal. The DAC circuit may include a number of bits (e.g., 2-3 bits) to set the signal level. This may also be useful to reduce harmonic content. It may also reduce the Q needed for the resonator circuit. It may also reduce the need for accuracy of the resonant frequency of the resonant circuit.

The drive circuit and the LDO 818 of FIG. 8 can be included on an integrated circuit (IC) with the capacitive circuit element of the resonant circuit. The inductive circuit element can be integrated in the IC, can be a discrete inductor, or can be bonding wire inductance. The bias circuit can also be included on the IC, while the laser diode is external to the IC. Thus, the amplitude tuning with the tunable LDO and pull up assist reduces the number of large off-chip components needed to drive the laser diode. Other options for generating one or both of the drive supply voltage and the pre-drive supply voltage are possible (e.g., using linear or switched mode power supplies).

Returning to FIG. 3, the resonant frequency $\omega_0$ of the resonant circuit 310 should match the frequency of the input signal $V_{DRV}$. However, variation in the inductance and capacitance of $L_{DRV}$ and $C_{DRV}$ can shift $\omega_0$ and degrade performance of the laser diode driver. It is helpful for the resonant circuit 310 to be adjustable to tune the resonant frequency $\omega_0$ substantially to the frequency of the input drive signal $V_{DRV}$ (e.g., to within 1% or less of the frequency of the input drive signal or within 10% or less of the frequency of the input drive signal). One way to make the resonant circuit tunable is to make the capacitive circuit element $C_{DRV}$ a tunable capacitance circuit.

Figure 11:
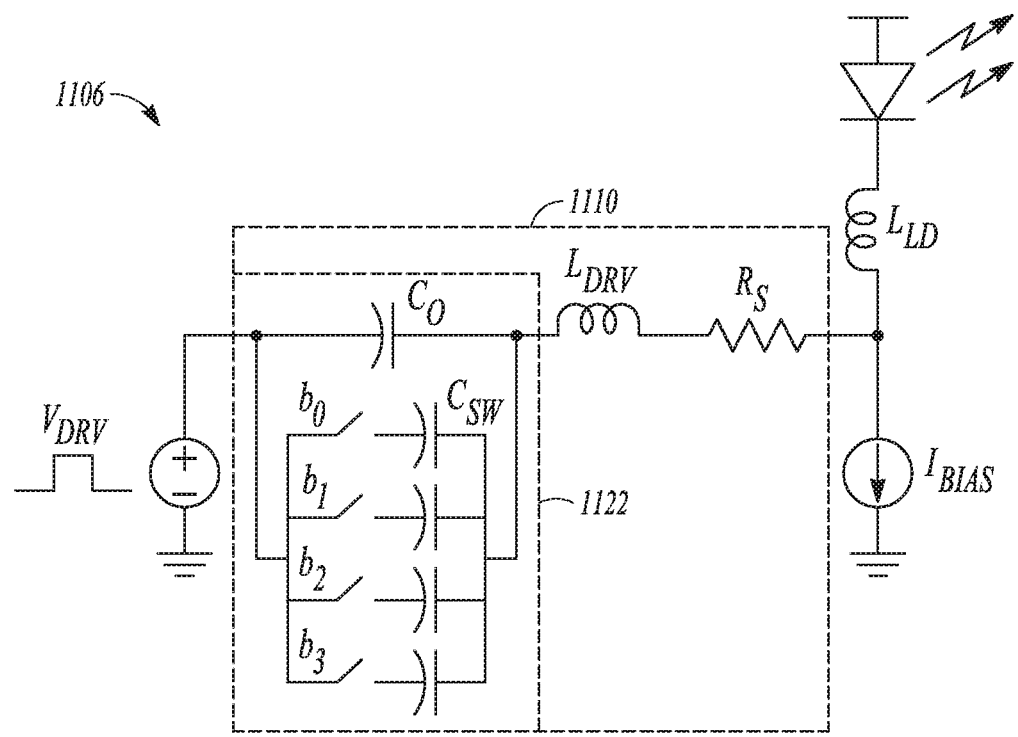
FIG. 11 is circuit schematic of another example of a laser emitter circuit.

FIG. 11 is circuit schematic of another example of a laser emitter circuit 1106. The laser emitter circuit includes a resonant circuit 1110 that includes a tunable capacitance circuit 1122. The tunable capacitance circuit 1122 includes a tunable bank of capacitive circuit elements that are enabled into the resonant circuit using one or more switches. In the example of FIG. 11, the tunable capacitance circuit 1122 has a 4-bit resolution corresponding to four switches coupled to capacitance values that are binary-weighted. The overall capacitance of the tunable capacitance circuit 1122 can be changed by turning on any combination of zero to four switches to set the capacitance. By changing the capacitance, the resonant frequency $\omega_0$ of the resonant circuit 110 can be tuned so that, in the worst case, the mismatch between $\omega_0$ and the frequency of $V_{DRV}$ is 1.25%. The tunable capacitance circuit 1122 provides discrete fine tuning of capacitance that can overcome ±200% variation in resonant frequency $\omega_0$. Further, the tuning technique can be extended to allow setting the $\omega_0$ of the resonant circuit 1110 to multiple operating frequencies by introducing extra switchable capacitive banks or separate drive circuits as described below.

In practice, the switches of the tunable capacitance circuit are implemented with NMOS devices whose parasitics can play an important role in determining the realized value of $\omega_0$. The NMOS switch device should be sized to minimize the on-resistance $R_{ON}$ of the switch. However, this typically means making the switch larger which results in a significant amount of drain-to-bulk capacitance $C_{DB}$, drain-to-source capacitance $C_{DS}$, and source-to-bulk capacitance $C_{SB}$. This can affect the overall capacitance of the tunable capacitance circuit 1122.

Figure 12:
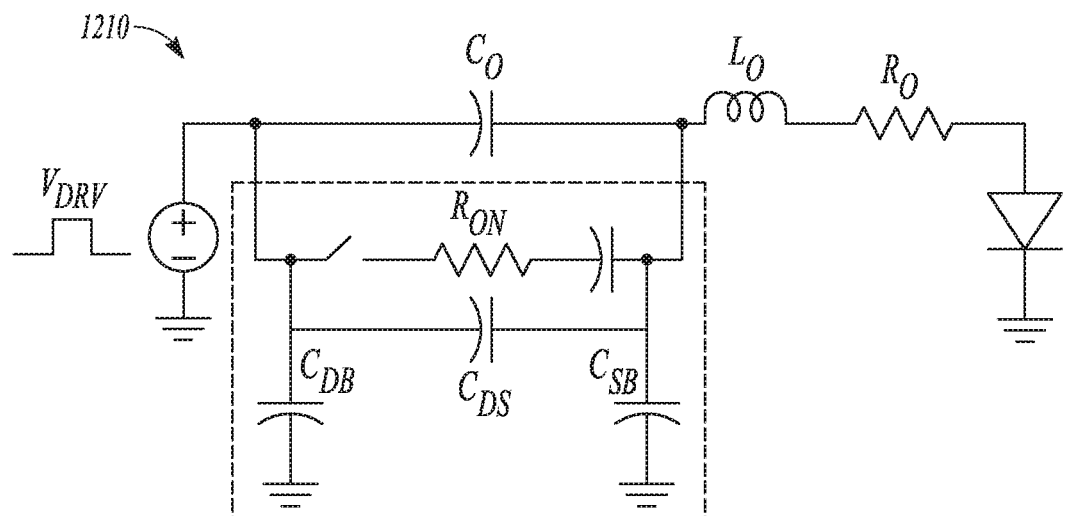
FIG. 12 is a circuit schematic of an example of a resonant circuit.

FIG. 12 is a circuit schematic of a resonant circuit 1210 including an equivalent circuit model of one switch of the tunable bank of capacitive circuit elements, and the capacitance $C_{SW}$ switched into the circuit by the switch. When a switch is an off state, $C_{SW}$ is in series with $C_{DS}$ and $C_{SB}$. This means there is an effective capacitance $C_{EFF}$ of $$C_{EFF} = \frac{C_{SW}(C_{SB} + C_{DS})}{C_{SW} + C_{SB} + C_{DS}}$$

when the switch is off, as opposed to a capacitance of zero for an ideal switch. This off capacitance can be compensated for by properly choosing capacitance values so that $C_{SW}$ dominates the series combination of capacitance. Moreover, the switch transistor should be a high voltage device because when the switch is off, a high $V_{DS}$ is dropped across the off switch.

Figure 13:
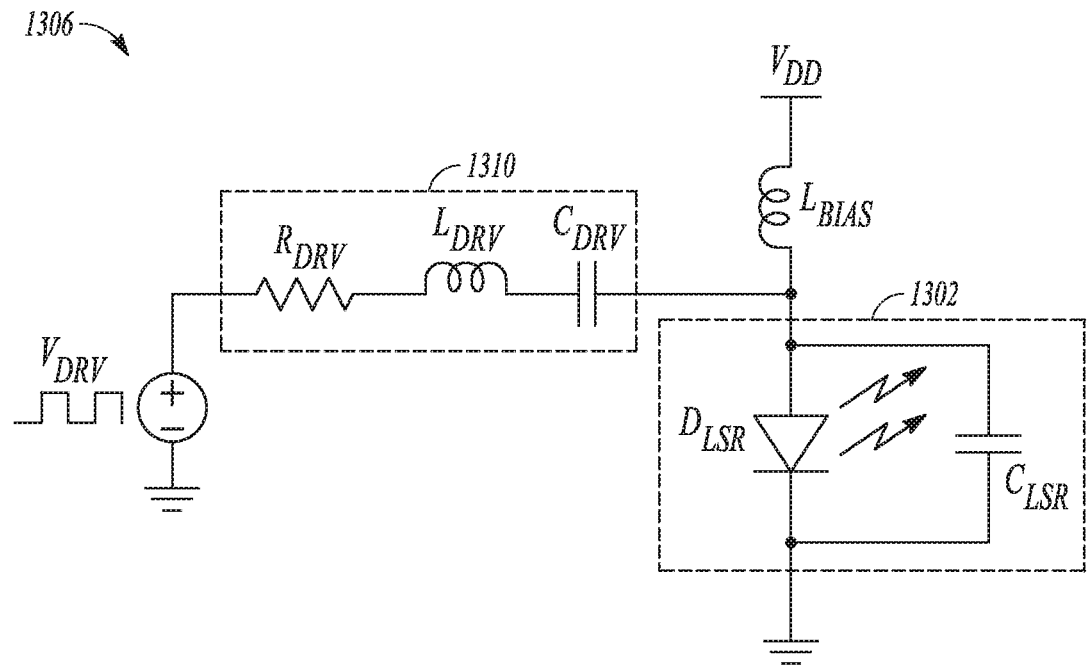
FIG. 13 is circuit schematic of another example of a laser emitter circuit.

FIG. 13 is a circuit schematic of another example of a laser emitter circuit 1306. Similar to the example of FIG. 3, the laser emitter circuit 1306 includes a resonant circuit 1310. A difference from the resonant circuit of FIG. 3 is that the resonant circuit 1310 is coupled to the anode of the LD 1302. The laser emitter circuit 1306 also shows a bias inductance $L_{BIAS}$ that is also coupled to the anode of LD 1302. Capacitor $C_{LSR}$ is parasitic capacitance of the laser diode.

The resonant circuit 1310 includes a series RLC tank circuit comprised of resistive circuit element $R_{DRV}$, capacitive circuit element $C_{DRV}$, and inductive circuit element $L_{DRV}$ arranged in series. $V_{DRV}$ can be a square wave signal and the resonant circuit filters the square wave input signal to produce a continuous wave sinusoidal drive signal to drive the laser diode. Resistive circuit element $R_{DRV}$ can be the lumped parasitic resistance of the circuit used to generate the $V_{DRV}$ signal and the parasitic resistance along the series RLC tank circuit. $C_{DRV}$ and $L_{DRV}$ can be passive circuit components external to an integrated circuit that includes the driver circuit that generates $V_{DRV}$. $L_{DRV}$ can include parasitic inductance (e.g., from bond wires) in the circuit loop that includes the driver circuit, the resonant circuit 1310, and the LD 1302.

Figure 14:
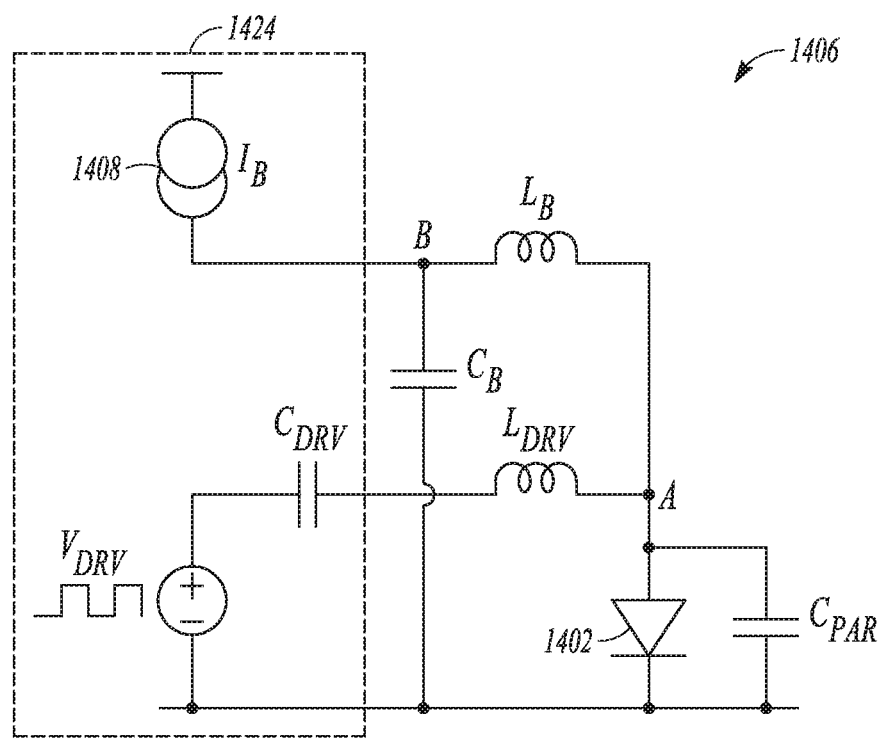
FIG. 14 is circuit schematic of another example of a laser emitter circuit.

FIG. 14 is a circuit schematic of another example of a laser emitter circuit 1406. The circuit 1406 includes a resonant circuit 1410 coupled to the anode of the LD 1402. The resonant circuit 1410 includes capacitive circuit element $C_{DRV}$ and inductive circuit element $L_{DRV}$ and filters the input signal $V_{DRV}$ to produce a continuous wave sinusoidal drive signal to drive the LD 1402. A bias circuit 1408 can be a current source that supplies a bias current $I_B$ to LD 1402 to ensure that the LD 1402 remains on for the driving sinusoidal signal. The circuit 1406 includes bias inductance $L_B$ in series from bias node B to the summing node A, and bias capacitance $C_B$. Bias capacitance $C_B$ reduces the impedance on bias node B to avoid a high Vripple on node B that could be seen by the bias circuit 1408. In the example of FIG. 14, the bias circuit 1408, driver circuit that generates $V_{DRV}$ and capacitive circuit element $C_{DRV}$ can be included on an IC 1424. The capacitance of $C_{DRV}$ is made much larger than the load capacitance seen by the resonant circuit 1410 which includes parasitic capacitance $C_{PAR}$ of LD 1402. Bias inductance $L_B$ is made larger than inductive circuit element $L_{DRV}$. One or both of $L_{DRV}$ and $L_B$ can be the parasitic inductance of bonding wire used in the laser emitter circuit 1406. The driver amplitude of $V_{DRV}$ could be controlled by altering the supply voltage to the driver, or by altering the supply voltage to the pre-driver within the circuit. The supply voltage could come from a linear regulator or from a switch mode regulator.

Figure 15:
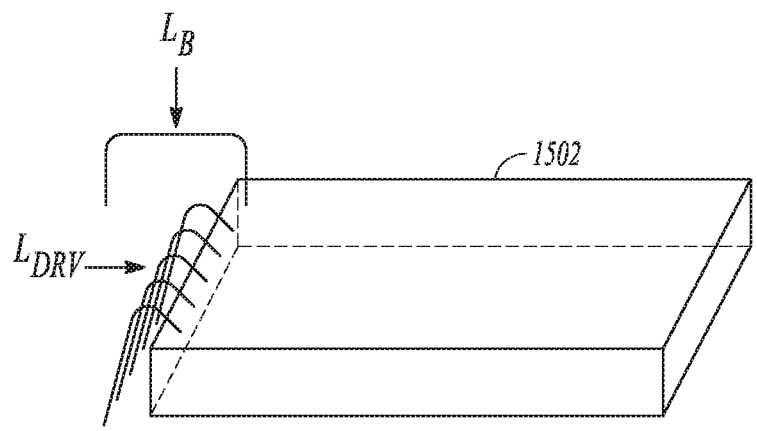
FIG. 15 is an illustration of examples of using bonding wires to form circuit inductances.

FIG. 15 is an illustration of using bonding wires to form circuit inductances. The bonding wires are arranged at the IC of the laser diode 1502. Bias inductance $L_B$ can be formed using a larger looped bond wire to make the higher inductance to make a higher impedance on the bias line of the circuit. Inductance $L_{DRV}$ of the resonant circuit 1410 of FIG. 4 can be formed from multiple parallel short bond wires to form a lower inductance and the dominant (lower) impedance.

Figure 16:
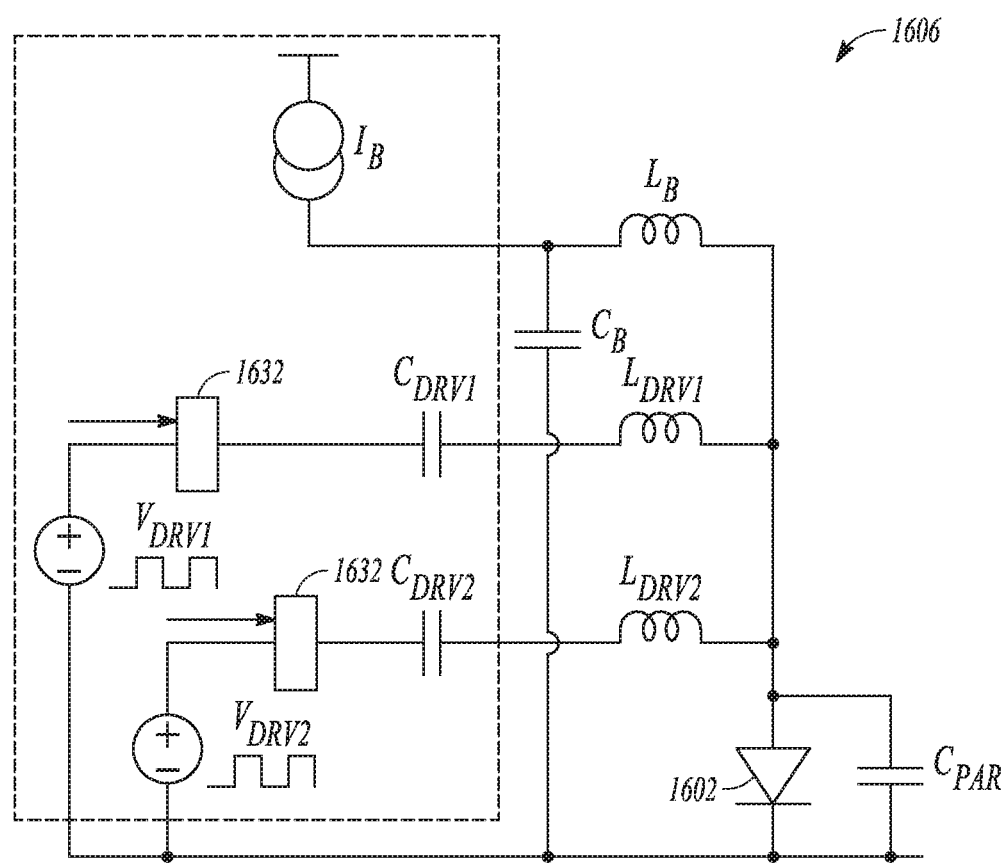
FIG. 16 is a circuit schematic of another example of a laser emitter circuit.

FIG. 16 is a circuit schematic of another example of a laser emitter circuit 1606. It may be useful to have multiple drive paths in a laser emitter circuit to provide the option to drive the laser diode with one of multiple drive signals. The example of FIG. 16 includes two drive paths for LD 1602. One drive path applies drive signal $V_{DRV1}$ having a higher frequency (e.g., 200 MHz), and the other drive path applies drive signal $V_{DRV2}$ having a lower frequency (e.g., Each of the drive paths includes a resonant circuit 1610, 1630 to filter the drive signal to provide a continuous wave sinusoidal signal to the LD 1602. In certain aspects, the drive signals $V_{DRV1}$ and $V_{DRV2}$ are square wave signals. The drive signals can be enabled to its corresponding resonant circuit using a high impedance or tristate-able driver 1632. The circuit also includes a bias circuit comprised of current source $I_B$, bias inductance $L_B$, and bypass capacitance $C_B$ as in the example of FIG. 14.

Resonant circuit 1610 includes $C_{DRV1}$ and $L_{DRV1}$. Resonant circuit 1630 includes $C_{DRV2}$ and $L_{DRV2}$. The capacitance of $C_{DRV1}$ is made much larger than the load capacitance seen by the resonant circuit 1610 which includes parasitic capacitance $C_{PAR}$ of LD 1602. The capacitance of $C_{DRV2}$ is made larger than $C_{DRV1}$, and the inductance $L_{DRV2}$ is larger than $L_{DRV1}$. Capacitances $C_{DRV1}$ and $C_{DRV2}$ may be fine-tunable capacitance circuits to tune the resonant frequencies $\omega_0{}^1$, $\omega_0{}^2$ of the resonant paths to the frequencies of its corresponding drive signal. Multiple drive paths with multiple resonant circuits may be a desirable alternative to changing the resonant frequency by using tunable capacitance or inductance circuits when the difference between the resonant frequency of the two drive signals is large. For example, to tune the resonant frequency of a resonant circuit between the 50 MHz and 200 MHz drive signals using one tunable capacitance circuit, the capacitance $C_{DRV}$ would need to change by 16 times.

Figure 17:
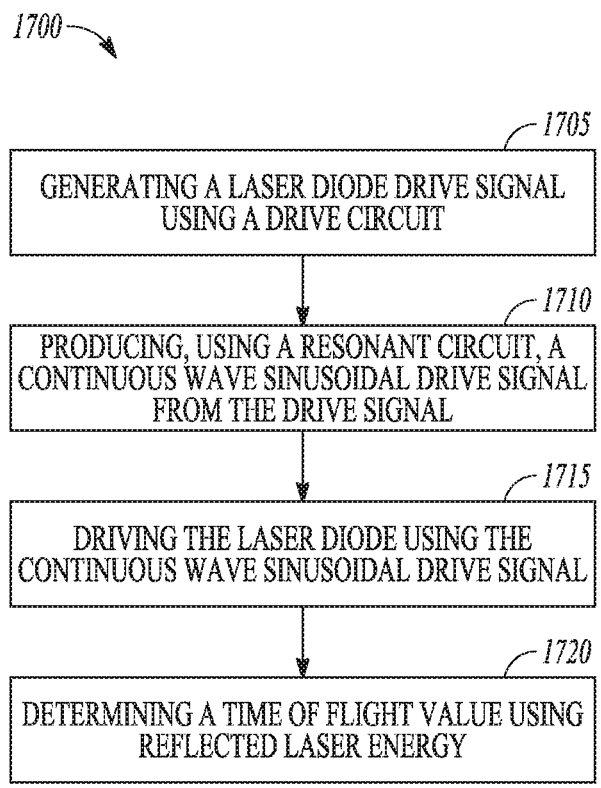
FIG. 17 is a flow diagram of an example of a method of operating a ToF sensor.

FIG. 17 is a flow diagram of an example of a method 1700 of operating a ToF sensor. At 1705, a drive signal is generated using a drive circuit. The drive signal may be a square wave, and the drive circuit may tunable amplitude such as the drive circuit 812 of FIG. 8. At 1710, a continuous wave sinusoidal drive signal is produced from the drive signal using a resonant circuit. The resonant circuit may be any of the resonant circuits described herein. At 1715, the laser diode is driven using the continuous wave sinusoidal drive signal to activate the laser diode.

The activation may cause the laser diode to emit a continuous sinusoidal wave of laser energy. The emitted laser energy can reflect off an object. Reflected laser energy can be detected by the ToF sensor (e.g., using a photo diode) and at 1720 the detected reflected laser energy can be used to determine a distance to an object, such as by the method described herein in regard to FIG. 1.

The devices systems and methods provide a highly integrated, low cost solution for driving an LD with a low total harmonic distortion (THD) sinusoidal signal with tunable amplitude and frequency.

ADDITIONAL DESCRIPTION AND ASPECTS

A first Aspect (Aspect 1) includes subject matter (such as a laser emitter circuit) comprising a laser diode, a driver circuit configured to generate a drive signal, and a resonant circuit coupled to the driver circuit and the laser diode, wherein the resonant circuit is configured to use the drive signal of the driver circuit to generate a continuous wave sinusoidal drive signal to drive the laser diode.

In Aspect 2, the subject matter of Aspect 1 optionally includes a bias circuit coupled to the laser diode, and the driver circuit is optionally configured to generate a drive signal with significant energy at substantially a resonant frequency of the resonant circuit. The resonant circuit is configured to produce the continuous wave sinusoidal drive signal from the drive signal and includes a capacitive circuit element coupled in series to the drive circuit, and an inductive circuit element arranged in series to the capacitive circuit element and the laser diode.

In Aspect 3, the subject matter of Aspect 2 optionally includes a driver circuit configured to generate a square wave drive signal and the resonant circuit is configured to produce the continuous wave sinusoidal drive signal from the square wave drive signal.

In Aspect 4, the subject matter of one or any combination of Aspects 1-3 optionally includes an amplitude tuning circuit configured to adjust a circuit supply of the driver circuit to adjust an amplitude of continuous wave sinusoidal drive signal.

In Aspect 5, the subject matter of Aspect 4 optionally includes a pre-driver circuit that includes a buffer circuit to provide a square wave drive signal as the drive signal, and an amplitude tuning circuit that includes a voltage regulator circuit with a tunable output voltage provided as a circuit supply to the buffer circuit.

In Aspect 6, the subject matter of Aspect 5 optionally includes an amplitude tuning circuit that includes a pull up assist transistor coupled to an output of the voltage regulator circuit, wherein the pull up assist transistor is only activated during a transition of an input signal to the buffer circuit.

In Aspect 7, the subject matter of one or any combination of Aspects 1-6 optionally includes a bias circuit coupled to one of a cathode or an anode of the laser diode. The bias circuit includes a bias inductance coupled to the laser diode and a current mirror coupled to bias inductance.

In Aspect 8, the subject matter of one or any combination of Aspects 1-7 optionally includes a resonant circuit tunable to adjust a resonant frequency of the resonant circuit to a frequency of the drive signal.

In Aspect 9, the subject matter of Aspect 8 optionally includes a tunable capacitance circuit.

In Aspect 10, the subject matter of Aspect 9 optionally includes a tunable capacitance circuit includes multiple capacitive circuit elements and at least one switch circuit, and wherein a capacitive circuit element coupled to the at least one switch circuit is greater than the parasitic capacitances of the switch circuit when the switch circuit is in an off state.

Aspect 11 includes subject matter (such as a laser diode drive circuit) or can be combined with one or any combination of Aspects 1-10 to include such subject matter, comprising a driver circuit configured to generate a drive signal, a resonant circuit, and a bias circuit. The resonant circuit has an input coupled to an output of the driver circuit and has an output for coupling to a laser diode. The resonant circuit is configured to produce a continuous wave sinusoidal drive signal from the drive signal to drive the laser diode. The bias circuit includes a bias inductance for coupling to the laser diode.

In Aspect 12, the subject matter of Aspect 11 optionally includes a bias circuit including a current mirror circuit including a first current mirror branch and a second current mirror branch, wherein the first current mirror branch is coupled to the bias inductance.

In Aspect 13, the subject matter of one or both of Aspect 11 and 12 optionally includes the laser diode. The resonant circuit optionally includes a capacitive circuit element coupled in series to the driver circuit and an inductive circuit element arranged in series to the capacitive circuit element and the cathode of the laser diode.

In Aspect 14, the subject matter of one or any combination of Aspects 11-13 optionally includes a resonant circuit tunable to adjust a resonant frequency of the resonant circuit to a frequency of the drive signal.

In Aspect 15, the subject matter of one or any combination of Aspects 11-14 optionally includes a resonant circuit that includes an inductive circuit element, and at least one of the bias inductance or the inductive circuit element of the resonant circuit is implemented using one or more bond wires of an integrated circuit that includes the laser diode.

In Aspect 16, the subject matter of one or any combination of Aspects 11-15 optionally includes an amplitude tuning circuit configured to adjust a circuit supply of the driver circuit to adjust an amplitude of continuous wave sinusoidal drive signal.

In Aspect 17, the subject matter of Aspect 16 optionally includes an amplitude tuning circuit that includes a voltage regulator circuit having a tunable output voltage provided as a circuit supply to the driver circuit.

In Aspect 18, the subject matter of one or any combination of Aspects 11-17 optionally includes a second drive circuit configured to generate a second drive signal and a second resonant circuit coupled to the second drive circuit and having an output for coupling to the laser diode, wherein the second resonant circuit is configured to produce a second continuous wave sinusoidal drive signal from the second drive signal to drive the laser diode.

Aspect 19 includes subject matter (such as a method of operating a laser emitter of a time of flight sensor) or can optionally be combined with one or any combination of Aspects 1-18 to include such subject matter, comprising generating a drive signal using a driver circuit, producing, using a resonant circuit, a continuous wave sinusoidal drive signal from the square wave drive signal, and driving the laser diode using the continuous wave sinusoidal drive signal.

In Aspect 20, the subject matter of Aspect 19 optionally includes biasing the operating current of the laser diode using a bias inductance coupled to the laser diode and a current mirror coupled to the bias inductor.

In Aspect 21, the subject matter of one or both of Aspects 19 and 20 optionally includes a driver circuit includes a pre-driver circuit and a main driver circuit, and adjusting a circuit supply of one or both of the pre-driver circuit and the main driver circuit to adjust the amplitude of the continuous wave sinusoidal drive signal.

In Aspect 22, the subject matter of one or any combination of Aspects 19-21 optionally includes tuning the resonant frequency of the resonant circuit to the frequency of the drive signal.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples" or "aspects." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A laser emitter circuit comprising:
   a laser diode;
   a driver circuit configured to generate a first drive signal; and
   a resonant circuit having a resonant frequency and coupled to the driver circuit and the laser diode, wherein the first drive signal has significant energy at substantially the resonant frequency of the resonant circuit and the resonant circuit generates a continuous wave sinusoidal drive signal to drive the laser diode.

2. The laser emitter circuit of claim 1, including:
   a bias circuit coupled to the laser diode; and
   wherein the resonant circuit includes:
   a capacitive circuit element coupled in series to the drive circuit; and
   an inductive circuit element arranged in series to the capacitive circuit element and the laser diode.

3. The laser emitter circuit of claim 2, wherein the driver circuit is configured to generate a square wave drive signal as the first drive signal and the resonant circuit is configured to produce the continuous wave sinusoidal drive signal from the square wave drive signal.

4. The laser emitter circuit of claim 1, including an amplitude tuning circuit configured to adjust a circuit supply of the driver circuit to adjust an amplitude of continuous wave sinusoidal drive signal.

5. The laser emitter circuit of claim 4,
   wherein the driver circuit includes a pre-driver circuit that includes a buffer circuit to provide a square wave drive signal as the first drive signal; and
   wherein the amplitude tuning circuit includes a voltage regulator circuit with a tunable output voltage provided as a circuit supply to the buffer circuit.

6. The laser emitter circuit of claim 5, wherein the amplitude tuning circuit includes a pull up assist transistor coupled to an output of the voltage regulator circuit, wherein the pull up assist transistor is only activated during a transition of an input signal to the buffer circuit.

7. The laser emitter circuit of claim 1, including:
a bias circuit coupled to one of a cathode or an anode of the laser diode, wherein the bias circuit includes:
a bias inductance coupled to the laser diode; and
a current mirror coupled to bias inductance.

8. The laser emitter circuit of claim 1, wherein the resonant circuit is tunable to adjust a resonant frequency of the resonant circuit to a frequency of the first drive signal.

9. The laser emitter circuit of claim 8, wherein the resonant circuit includes a tunable capacitance circuit.

10. The laser emitter circuit of claim 9, wherein the tunable capacitance circuit includes multiple capacitive circuit elements and at least one switch circuit, and wherein a capacitive circuit element coupled to the at least one switch circuit is greater than the parasitic capacitances of the switch circuit when the switch circuit is in an off state.

11. A laser diode drive circuit comprising:
a resonant circuit having a resonant frequency and including an output for coupling to a laser diode, and an input; and
a driver circuit coupled to the input of the resonant circuit and configured to provide a first drive signal to the resonant circuit having significant energy at the resonant frequency of the resonant circuit, wherein the resonant circuit is configured to produce a continuous wave sinusoidal drive signal from the first drive signal and drive the laser diode with the continuous wave sinusoidal drive signal; and
a bias circuit including a bias inductance for coupling to the laser diode.

12. The laser diode drive circuit of claim 11; wherein the bias circuit includes a current mirror circuit including a first current mirror branch and a second current mirror branch, wherein the first current mirror branch is coupled to the bias inductance.

13. The laser diode drive circuit of claim 11, including the laser diode, and wherein the resonant circuit includes:
a capacitive circuit element coupled in series to the driver circuit; and
an inductive circuit element arranged in series to the capacitive circuit element and the laser diode.

14. The laser diode drive circuit of claim 13, wherein the resonant circuit is tunable to adjust a resonant frequency of the resonant circuit to a frequency of the drive signal.

15. The laser diode drive circuit of claim 11, wherein the resonant circuit includes an inductive circuit element, and wherein at least one of the bias inductance or the inductive circuit element of the resonant circuit are implemented using one or more bond wires of an integrated circuit that includes the laser diode.

16. The laser diode drive circuit of claim 11, including an amplitude tuning circuit configured to adjust a circuit supply of the driver circuit to adjust an amplitude of continuous wave sinusoidal drive signal.

17. The laser diode drive circuit of claim 16, wherein the amplitude tuning circuit includes a voltage regulator circuit having a tunable output voltage provided as a circuit supply to the driver circuit.

18. The laser diode drive circuit of claim 11, including a second drive circuit configured to generate second drive signal and a second resonant circuit coupled to the second drive circuit and having an output for coupling to the laser diode, wherein the second resonant circuit is configured to produce a second continuous wave sinusoidal drive signal from the second drive signal to drive the laser diode.

19. A method of operating a laser emitter of a time of flight sensor, the method comprising:
generating a first drive signal using a driver circuit, wherein the first drive signal has significant energy at a first signal frequency;
producing, using a resonant circuit having a resonant frequency substantially equal to the first signal frequency, a continuous wave sinusoidal drive signal from the first drive signal; and
driving a laser diode of the laser emitter using the continuous wave sinusoidal drive signal.

20. The method of claim 19, including biasing the operating current of the laser diode using a bias inductance coupled to the laser diode and a current mirror coupled to the bias inductor.

21. The method of claim 19, wherein the driver circuit includes a pre-driver circuit and a main driver circuit, and the method further includes adjusting a circuit supply of one of the pre-driver circuit or the main driver circuit to adjust the amplitude of the continuous wave sinusoidal drive signal.

22. The method of claim 19, including tuning the resonant frequency of the resonant circuit to the frequency of the drive signal.

* * * * *